United States Patent
Hertkorn

(10) Patent No.: US 10,535,515 B2
(45) Date of Patent: Jan. 14, 2020

(54) METHOD OF PRODUCING AN OPTOELECTRONIC SEMICONDUCTOR CHIP AND OPTOELECTRONIC SEMICONDUCTOR CHIP

(71) Applicant: OSRAM Opto Semiconductors GmbH, Regensburg (DE)

(72) Inventor: Joachim Hertkorn, Wörth an der Donau (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 49 days.

(21) Appl. No.: 15/527,402

(22) PCT Filed: Nov. 11, 2015

(86) PCT No.: PCT/EP2015/076340
§ 371 (c)(1),
(2) Date: May 17, 2017

(87) PCT Pub. No.: WO2016/078986
PCT Pub. Date: May 26, 2016

(65) Prior Publication Data
US 2017/0352535 A1    Dec. 7, 2017

(30) Foreign Application Priority Data
Nov. 20, 2014   (DE) .......................... 10 2014 116 999

(51) Int. Cl.
*H01L 29/18*   (2006.01)
*H01L 21/02*   (2006.01)
(Continued)

(52) U.S. Cl.
CPC .... *H01L 21/02381* (2013.01); *H01L 21/0242* (2013.01); *H01L 21/02458* (2013.01);
(Continued)

(58) Field of Classification Search
CPC ................................. H01L 33/06; H01L 33/46
(Continued)

(56) References Cited

U.S. PATENT DOCUMENTS 5,676,752 A * 10/1997 Bozler .................... C30B 25/04
  117/89
6,015,979 A *  1/2000 Sugiura ................ H01L 33/007
  257/103

(Continued)

FOREIGN PATENT DOCUMENTS

DE    10 2011 114 671 A1    4/2013
DE    10 2012 101 211 A1    8/2013
(Continued)

OTHER PUBLICATIONS

Kazumasa Hiramatsu et al., "Fabrication and characterization of low defect density GaN using facet-controlled epitaxial lateral overgrowth (FACELO)," Journal of Crystal Growth, vol. 221, 2000, pp. 316-326.
(Continued)

*Primary Examiner* — Jay C Kim
(74) *Attorney, Agent, or Firm* — DLA Piper LLP (US)

(57) ABSTRACT

A method of producing an optoelectronic semiconductor chip includes in order: A) creating a nucleation layer on a growth substrate, B) applying a mask layer on to the nucleation layer, C) growing a coalescence layer, wherein the coalescence layer is grown starting from regions of the nucleation layer not covered by mask islands having a first main growth direction perpendicular to the nucleation layer so that ribs are formed, D) further growing the coalescence layer with a second main growth direction parallel to the nucleation layer to form a contiguous and continuous layer, E) growing a multiple quantum well structure on the coalescence layer, F) applying a mirror having metallic contact regions that impress current into the multiple quantum well
(Continued)

structure and mirror islands for the total reflection of radiation generated in the multiple quantum well structure, and G) detaching the growth substrate and creating a roughening by etching.

13 Claims, 5 Drawing Sheets

(51) Int. Cl.
*H01L 33/06* (2010.01)
*H01L 33/46* (2010.01)
*H01L 23/00* (2006.01)

(52) U.S. Cl.
CPC .. *H01L 21/02639* (2013.01); *H01L 21/02647* (2013.01); *H01L 24/24* (2013.01); *H01L 24/82* (2013.01); *H01L 33/06* (2013.01); *H01L 33/46* (2013.01); *H01L 2224/24051* (2013.01)

(58) Field of Classification Search
USPC .......................................................... 257/88
See application file for complete search history.

(56) References Cited

U.S. PATENT DOCUMENTS

| | | | | |
|---|---|---|---|---|
| 6,030,849 A * | 2/2000 | Hasegawa | ........... | H01L 21/0242 117/106 |
| 6,153,010 A * | 11/2000 | Kiyoku | ................ | B82Y 20/00 117/106 |
| 6,201,823 B1 * | 3/2001 | Kimura | ................ | H01L 33/145 257/103 |
| 6,252,261 B1 * | 6/2001 | Usui | ...................... | B82Y 20/00 257/190 |
| 6,348,096 B1 * | 2/2002 | Sunakawa | ............... | C30B 25/02 117/88 |
| 6,377,596 B1 * | 4/2002 | Tanaka | ................... | B82Y 20/00 257/52 |
| 6,420,198 B1 * | 7/2002 | Kimura | ................ | H01L 33/145 257/E33.067 |
| 6,582,986 B2 * | 6/2003 | Kong | ................ | H01L 21/0237 257/E21.112 |
| 6,597,017 B1 * | 7/2003 | Seko | .................. | H01S 5/32341 257/103 |
| 6,623,560 B2 * | 9/2003 | Biwa | ...................... | C30B 25/02 117/95 |
| 6,693,021 B1 * | 2/2004 | Motoki | .................. | B82Y 20/00 117/84 |
| 6,939,730 B2 * | 9/2005 | Goto | ........................ | C30B 25/02 257/E21.108 |
| 6,979,584 B2 * | 12/2005 | Koike | .................... | B82Y 20/00 257/E21.108 |
| 6,994,751 B2 * | 2/2006 | Hata | ...................... | B82Y 20/00 117/86 |
| 7,132,730 B2 * | 11/2006 | Dwiliński | .................. | C30B 7/00 257/615 |
| 7,208,393 B2 * | 4/2007 | Haskell | .................. | C30B 25/02 257/E21.097 |
| 7,220,658 B2 * | 5/2007 | Haskell | .................. | C30B 25/02 257/E21.097 |
| 7,355,208 B2 * | 4/2008 | Hata | ...................... | B82Y 20/00 257/618 |
| 7,361,576 B2 * | 4/2008 | Imer | ................... | H01L 21/0242 257/E21.097 |
| 7,704,860 B2 * | 4/2010 | Shimamoto | ....... | H01L 21/02389 438/481 |
| 7,777,250 B2 * | 8/2010 | Lochtefeld | ........ | H01L 21/02647 257/190 |
| 7,956,360 B2 * | 6/2011 | Haskell | ............ | H01L 21/02378 257/64 |
| 8,202,752 B2 * | 6/2012 | Huang | ............. | H01L 21/02458 438/172 |
| 8,283,239 B2 * | 10/2012 | Beaumont | ............... | C30B 25/02 438/478 |
| 8,574,968 B2 * | 11/2013 | Arena | ................. | H01L 21/0237 257/E21.04 |
| 9,136,439 B2 * | 9/2015 | Akimoto | ................. | H01L 33/62 |
| 9,224,595 B2 * | 12/2015 | Kishino | ................. | B82Y 20/00 |
| 9,397,262 B2 * | 7/2016 | Lutgen | ................ | H01L 21/0237 |
| 9,490,119 B2 * | 11/2016 | Wunderer | ........... | H01L 21/0254 |
| 9,530,930 B2 * | 12/2016 | Liu | ...................... | H01L 33/0079 |
| 9,559,251 B2 * | 1/2017 | Kim | ........................ | H01L 33/32 |
| 9,711,354 B2 * | 7/2017 | Jang | .................. | H01L 21/02647 |
| 9,793,434 B2 * | 10/2017 | Kitano | .................... | H01L 33/10 |
| 2002/0056840 A1 | 5/2002 | Tsai et al. | | |
| 2004/0142503 A1 | 7/2004 | Lee et al. | | |
| 2005/0042779 A1 | 2/2005 | Ito et al. | | |
| 2008/0054296 A1 | 3/2008 | Yoon et al. | | |
| 2010/0208763 A1 | 8/2010 | Engl et al. | | |
| 2013/0140525 A1 | 6/2013 | Chen et al. | | |
| 2013/0306980 A1 * | 11/2013 | Niiyama | ............. | H01L 29/0607 257/76 |
| 2014/0138703 A1 | 5/2014 | Avramescu et al. | | |

FOREIGN PATENT DOCUMENTS

| | | |
|---|---|---|
| DE | 10 2012 107 001 A1 | 2/2014 |
| DE | 10 2012 217 644 A1 | 3/2014 |
| DE | 11 2013 004 996 T5 | 7/2015 |
| EP | 0 874 405 A2 | 10/1998 |
| EP | 1 081 818 A2 | 3/2001 |
| KR | 2010-0016401 A | 2/2010 |
| WO | 2013/120638 A1 | 8/2013 |
| WO | 2014/048805 A1 | 4/2014 |

OTHER PUBLICATIONS

Pierre Gibart, "Metal organic vapour phase epitaxy of GaN and lateral overgrowth," Reports on Progress in Physics, vol. 67, No. 5, 2004, pp. 667-715 (Abstract).

* cited by examiner

A)

B)

C)

D)

E)

I)

J)

K)

L)

M)

N)

METHOD OF PRODUCING AN OPTOELECTRONIC SEMICONDUCTOR CHIP AND OPTOELECTRONIC SEMICONDUCTOR CHIP

TECHNICAL FIELD

This disclosure relates to a method of producing an optoelectronic semiconductor chip and an optoelectronic semiconductor chip produced thereby.

BACKGROUND

It could be helpful to provide an optoelectronic semiconductor chip having high internal and external quantum efficiency.

SUMMARY

I provide a method of producing an optoelectronic semiconductor chip including in order: A) creating a nucleation layer on a growth substrate, B) applying a mask layer on to the nucleation layer, wherein the mask layer is formed by a plurality of mask islands, C) growing a coalescence layer, wherein the coalescence layer is grown starting from regions of the nucleation layer not covered by the mask islands having a first main growth direction perpendicular to the nucleation layer so that ribs are formed, which when seen in a top view form a lattice and have trapezoidal cross-sectional surfaces, D) further growing the coalescence layer with a second main growth direction parallel to the nucleation layer to form a contiguous and continuous layer, E) growing a multiple quantum well structure on the coalescence layer, F) applying a mirror having metallic contact regions that impress current into the multiple quantum well structure and mirror islands for the total reflection of radiation generated in the multiple quantum well structure, and G) detaching the growth substrate and creating a roughening by etching, wherein the mask layer serves as an etching mask, wherein the mirror islands includes a transparent, dielectric material and are electrically insulating in a direction perpendicular to the multiple quantum well structure when the semiconductor chip is used for its intended purpose.

I also provide an optoelectronic semiconductor chip produced by the method of producing an optoelectronic semiconductor chip including in order: A) creating a nucleation layer on a growth substrate, B) applying a mask layer on to the nucleation layer, wherein the mask layer is formed by a plurality of mask islands, C) growing a coalescence layer, wherein the coalescence layer is grown starting from regions of the nucleation layer not covered by the mask islands having a first main growth direction perpendicular to the nucleation layer so that ribs are formed, which when seen in a top view form a lattice and have trapezoidal cross-sectional surfaces, D) further growing the coalescence layer with a second main growth direction parallel to the nucleation layer to form a contiguous and continuous layer, E) growing a multiple quantum well structure on the coalescence layer, F) applying a mirror having metallic contact regions that impress current into the multiple quantum well structure and mirror islands for the total reflection of radiation generated in the multiple quantum well structure, and G) detaching the growth substrate and creating a roughening by etching, wherein the mask layer serves as an etching mask, wherein the mirror islands includes a transparent, dielectric material and are electrically insulating in a direction perpendicular to the multiple quantum well structure when the semiconductor chip is used for its intended purpose, wherein the mask islands of the mask layer or a partial layer of the mask islands have/has an absorptance of at least 60% for at least a partial region of the spectrum between 240 nm and 480 nm seen in transmission, and the nucleation layer and the growth substrate have an absorptance of no more than 5% in this partial region of the spectrum, seen in transmission.

I further provide a method of producing an optoelectronic semiconductor chip including in order: A) creating a nucleation layer on a growth substrate, B) applying a mask layer on to the nucleation layer, wherein the mask layer is formed by a plurality of mask islands, C) growing a coalescence layer, wherein the coalescence layer is grown starting from regions of the nucleation layer not covered by the mask islands having a first main growth direction perpendicular to the nucleation layer so that ribs are formed, which when seen in a top view form a lattice and which have trapezoidal cross-sectional surfaces, D) further growing the coalescence layer with a second main growth direction parallel to the nucleation layer to form a contiguous and continuous layer, E) growing a multiple quantum well structure on the coalescence layer, F) applying a mirror having metallic contact regions that impress current into the multiple quantum well structure and mirror islands for the total reflection of radiation generated in the multiple quantum well structure, and G) detaching the growth substrate and creating a roughening by etching, wherein the mask layer serves as an etching mask.

LIST OF REFERENCE NUMBERS

Figure 1:
FIGS. 1A-1P show schematic diagrams of method steps of a method of producing an optoelectronic semiconductor chip.
Figure 1:
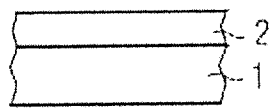
Figure 1:
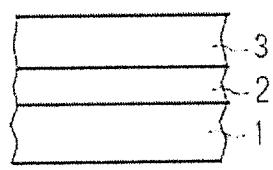
Figure 1:
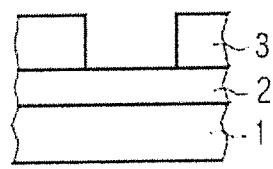
Figure 1:
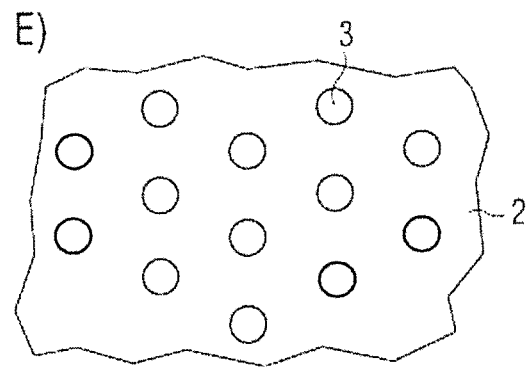
Figure 1:
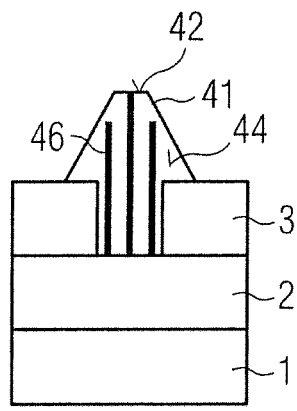
Figure 1:
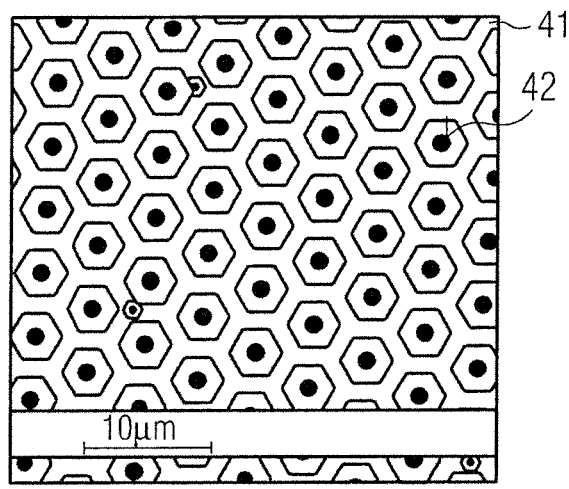
Figure 1:
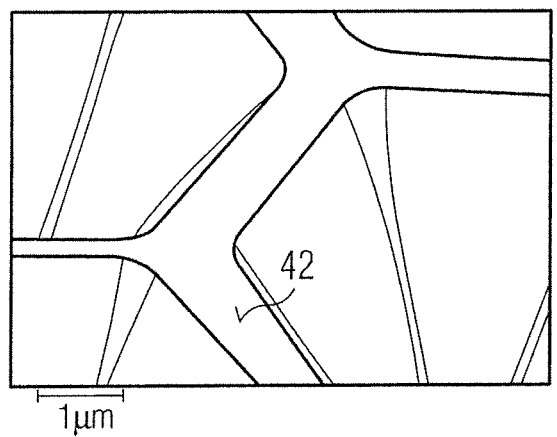
Figure 1:
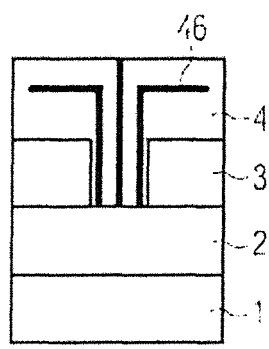
Figure 1:
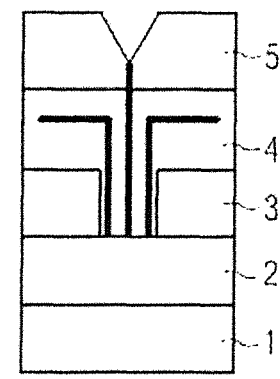
Figure 1:
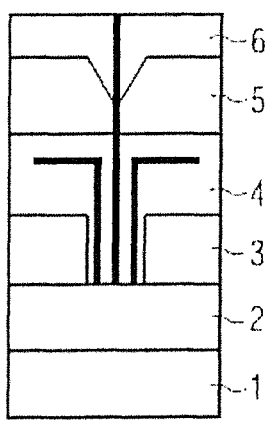
Figure 1:
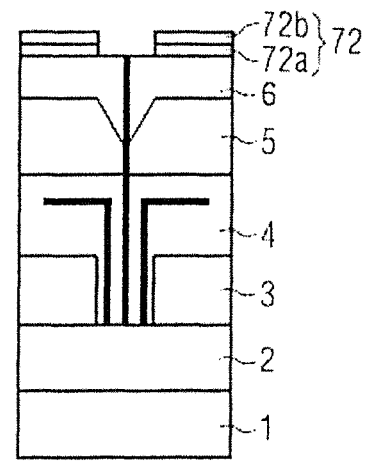
Figure 1:
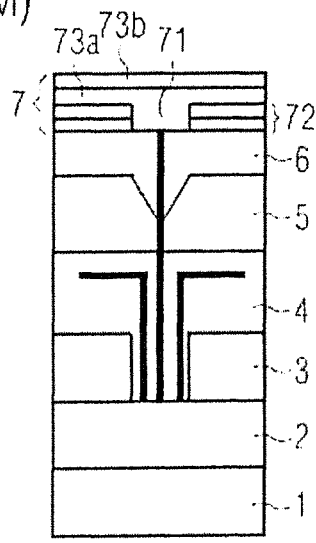
Figure 1:
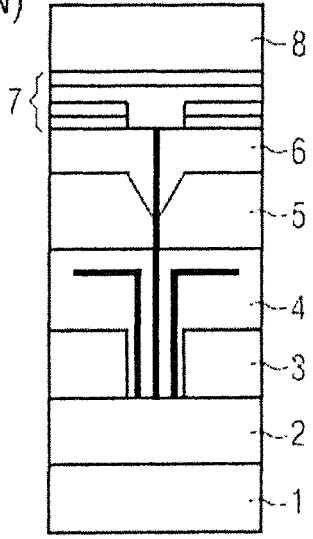
Figure 1:
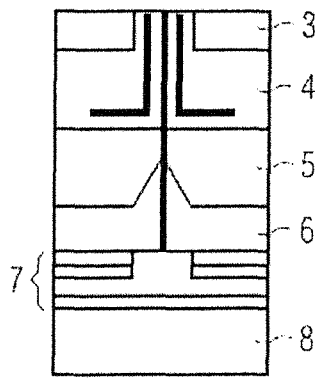
Figure 1:
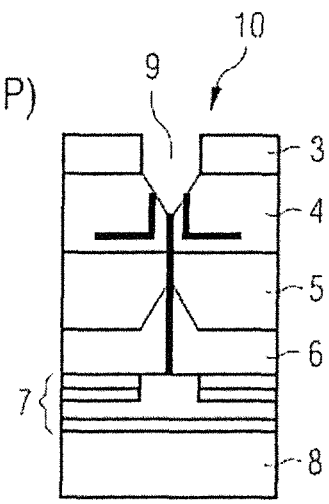

1 Growth substrate
2 Nucleation layer
3 Mask layer
4 Coalescence layer
41 Rib of the coalescence layer
42 Upper side of a rib
44 Trapezoidal cross-sectional surface of a rib
46 Displacement, V-defect
48 Lattice cell
5 Multiple quantum well structure
51 Quantum well layer
52 Barrier layer
6 Top layer
7 Mirror
71 Metallic contact region of the mirror
72 Mirror island of the mirror
73 Closing mirror layer
8 Carrier
9 Roughening
10 Optoelectronic semiconductor chip
$E_c$ Energy gap

DETAILED DESCRIPTION

My method produces an optoelectronic semiconductor chip. The semiconductor chip is preferably a radiation-emitting semiconductor chip. A maximum-intensity wavelength of the emitted radiation is, for example, at least 360 nm or 420 nm and/or no more than 1500 nm or 750 nm or 550 nm or 495 nm. Particularly preferably, the optoelectronic semiconductor chip is a light-emitting diode or LED for short.

The method may comprise the step of creating a nucleation layer on a growth substrate. The growth substrate can be a foreign substrate with regard to a material of the nucleation layer. In other words, the growth substrate is then based on a material or material system other than that of the nucleation layer. For example, the growth substrate is a sapphire substrate or a silicon substrate. The nucleation layer can comprise one or more partial layers. The partial layers can differ from one another in their material composition.

The method may comprise the step of applying a mask layer on to the nucleation layer. The mask layer can comprise one or more partial layers stacked one on top of another. The mask layer here is formed from a plurality of mask islands. The mask islands preferably represent material regions composed of a material of the mask layer not connected to one another by any material of the mask layer itself. The mask islands preferably all take the same form, in particular seen in top view. Alternatively, it is also possible that the mask islands are differently shaped.

The method may comprise the step of growing a coalescence layer. The coalescence layer is preferably formed from a semiconductor material and is preferably based on a material system similar to or the same as the nucleation layer.

The coalescence layer may be grown starting from regions of the nucleation layer not covered by the mask islands. In other words, the nucleation layer then forms a foundation for growth of the coalescence layer.

The coalescence layer may be grown with a first main growth direction in a first growth step. The first main growth direction is oriented perpendicular to the nucleation layer. In other words, a growth rate along the first main growth direction has higher values than growth in a direction parallel to the nucleation layer.

Ribs may be formed by the first growth step of the coalescence layer. The ribs preferably have a trapezoidal cross-sectional surface seen in a cross-section perpendicular to the nucleation layer. Thus, the ribs have an upper side facing away from the nucleation layer which is oriented parallel or substantially parallel to the nucleation layer.

The ribs and the upper sides of the ribs may form a lattice, seen in top view. The lattice is preferably a regular lattice. In particular, the lattice is a hexagonal lattice.

The first growth step of the coalescence layer may be followed by a second growth step. In the second growth step, growth takes place predominantly or exclusively along a second main growth direction oriented parallel to the nucleation layer. The second growth step takes place starting from the ribs formed in the first growth step. In particular, the first and second growth steps follow one immediately after the other. The two growth steps differ in their process parameters.

In the second growth step the coalescence layer may be grown to form a contiguous and continuous layer. In other words, in particular a contiguous, hole-free, gap-free coalescence layer is formed only in the second growth step. The contiguous and, on a side facing away from the nucleation layer, smooth layer forms a foundation for growth for further layers with a comparatively low dislocation density or defect density.

A single quantum well structure or, preferably, a multiple quantum well structure may be grown on the coalescence layer. It is possible that a further layer, in particular a current distribution layer that distributes current in a direction parallel to the multiple quantum well structure, is created between the multiple quantum well structure and the coalescence layer. Alternatively, it is possible that the coalescence layer itself is a current expansion layer.

A mirror may be created. The mirror comprises contact regions. The contact regions are preferably formed from a metallic material or comprise a metallic material. The contact regions are designed to impress current into the multiple quantum well structure.

The mirror may comprise a plurality of mirror islands. The mirror islands are designed for a total reflection of radiation generated in the multiple quantum well structure during operation of the finished optoelectronic semiconductor chip. Preferably, the mirror islands are each completely surrounded by the contact regions. The contact regions can be formed by a single, contiguous contact region.

The method may comprise the step of detaching the growth substrate from the nucleation layer. It is possible for the nucleation layer to be partially or completely detached and/or destroyed here.

A roughening may be created. Creation of the roughening takes place by etching, wherein the etching can take place by a dry chemical or wet chemical method. During this etching, by which the roughening is created, the mask layer serves as an etching mask.

The method may be designed to produce an optoelectronic semiconductor chip. The method comprises at least the following steps, preferably in the specified order:

A) creating a nucleation layer on a growth substrate,
B) applying a mask layer on to the nucleation layer, wherein the mask layer is formed by a plurality of mask islands,
C) growing a coalescence layer, wherein the coalescence layer is grown starting from regions of the nucleation layer not covered by the mask islands, having a first main growth direction perpendicular to the nucleation layer so that ribs are formed which, seen in top view, form a lattice and have trapezoidal cross-sectional surfaces,
D) further growing the coalescence layer with a second main growth direction parallel to the nucleation layer to form a contiguous and continuous layer,
E) growing a multiple quantum well structure on the coalescence layer,
F) applying a mirror having metallic contact regions that impress current into the multiple quantum well structure and mirror islands for the total reflection of radiation generated in the multiple quantum well structure, and
G) detaching the growth substrate and creating a roughening by etching, wherein the mask layer serves as an etching mask.

In the method described here, regions with a comparatively high defect density, in particular of so-called V-defects, also known as V-pits, are formed above the ribs on the upper sides of the ribs. The V-defects are predominantly localized to regions above the upper sides of the ribs. Between the upper sides of the ribs, regions with a reduced, low defect density are present. Along the V-defects, increased charge carrier transport takes place in a direction perpendicular to the multiple quantum well structure and into or through the multiple quantum well structure. Through these vertical current paths, owing to the V-defects, more quantum wells can be supplied with current, resulting in a reduction of current density per quantum well structure. As a result, efficiency of the semiconductor chip can be improved with higher current densities overall. Owing to the defect-free regions between the upper sides of the ribs, seen in top view, improved low current characteristics can also be achieved. As a result of the roughening, which preferably correlates to the regions with a high defect density, increased out-coupling efficiency of radiation can be achieved. Furthermore, reflection losses within the semiconductor chip are reduced by the mirror islands designed to be totally reflective. Thus, as a result of the method described here, a semiconductor chip with increased internal and external quantum efficiency can be produced.

The lattice formed by the ribs is arranged with the upper sides of the ribs in registry with the contact regions of the mirror, seen in top view. This means in particular that the hexagonal lattice formed by the upper sides of the ribs is in registry with the hexagonal lattice formed by the contact regions, seen in a top view. A shift between the two lattices relative to one another is preferably 100% or 50% or 25% or 5% of an average width of the upper sides of the ribs in a direction parallel to the multiple quantum well structure.

The nucleation layer, the coalescence layer, the current expansion layer, the multiple quantum well structure and/or a top layer on a side of the multiple quantum well structure facing away from the coalescence layer may form a semiconductor layer sequence.

The semiconductor layer sequence is preferably based on a III-V compound semiconductor material. The semiconductor material is, for example, a nitride compound semiconductor material such as $Al_nIn_{1-n-m}Ga_mN$, or a phosphide compound semiconductor material such as $Al_nIn_{1-n-m}Ga_mP$, or an arsenide compound semiconductor material such as $Al_nIn_{1-n-m}Ga_mAs$, wherein in each case $0 \le n \le 1$, $0 \le m \le 1$ and $n+m \le 1$. The semiconductor layer sequence can comprise dopants as well as additional constituents. For the sake of simplicity, however, only the essential constituents of the crystal lattice of the semiconductor layer sequence, i.e., Al, As, Ga, In, N or P, are stated, even if they can be partially replaced and/or supplemented by small quantities of other substances.

The semiconductor layer sequence may be based on the material system AlInGaN. In this case, the nucleation layer preferably comprises one or more partial layers composed of aluminum nitride, aluminum oxynitride and/or AlGaN. The nucleation layer can consist of one or more of these partial layers.

The mask layer may be made from a silicon oxide and/or a silicon nitride and/or from a silicon oxynitride. Alternatively, the mask layer can also be formed from another metal oxide or metal nitride such as aluminum oxide or aluminum nitride. The mask layer preferably has a thickness of at least 5 nm or 25 nm or 100 nm and/or of no more than 1 μm or 500 nm or 300 nm.

The mask layer may comprise a partial layer or the mask layer may be formed from a material having an absorbing action for visible light and/or near infrared radiation. A mask layer of this type can serve as a shadow mask in a lithography step and/or as a release layer in a laser lift-off method or LLO for short.

The mask islands of the mask layer or at least a partial layer of the mask islands may have an absorptance of at least 60% or 85% or 96% for at least a partial region of the spectrum between 240 nm and 480 nm seen in transmission. For example, absorptance of the mask islands is at least 70% or 80% at a wavelength of 240 nm and/or at least 5% or 10% at a wavelength of 480 nm. Alternatively or in addition, the nucleation layer and/or the growth substrate have/has an absorptance of no more than 5% or 1% in this partial region of the spectrum seen in transmission.

The coalescence layer may be formed from GaN. Alternatively, the coalescence layer comprises GaN and AlGaN, optionally in multiple partial layers. Preferably, the coalescence layer is doped, in particular n-doped.

The multiple quantum well structure may be based on the material system AlInGaN or InGaN. The multiple quantum well structure in this case has a plurality of alternating barrier layers and quantum well layers. In particular, the multiple quantum well structure is designed to generate blue light. The quantum well layers of the multiple quantum well structure can all be of the same construction or can be designed to emit radiation of different wavelengths.

For example, the multiple quantum well structure has at least 4 or 7 and/or no more than 20 or 12 or 10 radiatively active quantum well layers, for example, 9 radiatively active quantum well layers. In addition, further dark quantum well layers are optionally present which generate little or no radiation, for example, together no more than 2% of the total radiation generated in the multiple quantum well structure, when the semiconductor chip is operated for its intended purpose.

The top layer may directly border the mirror and the multiple quantum well structure. The top layer is preferably formed from the material system AlInGaN, preferably from GaN. Furthermore, the top layer is preferably doped, in particular p-doped.

The top layer may project into the multiple quantum well structure in some areas. In particular, a material of the top layer fills V-pits or V-holes in the multiple quantum well structure formed in the region of the V-defects. These V-defects, seen in cross-section, therefore, have a V-shape. In particular, these defects or recesses in the multiple quantum well structure into which the top layer projects have the shape of pyramids or truncated pyramids. These defects are also known as V-pits. In other words, the top layer or a material of the top layer can project into the multiple quantum well structure in the manner of a needle. These needles preferably do not penetrate the multiple quantum well structure completely in this case.

The metallic contact regions of the mirror may be formed from Ag, Al and/or a transparent conductive oxide such as ZnO or ITO. In particular, the contact regions consist of Ag, Al, an Ag alloy or an Al alloy. In this case, an adhesion promoter layer can be located between the metallic contact regions and the top layer. Such an adhesion promoter layer is formed, for example, from a transparent conductive oxide, TCO for short, or a metal such as Pt or Ti or Ni. It is possible that the contact regions are in direct, physical contact with the top layer if no adhesion promoter layer is present. Otherwise, the adhesion promoter layer preferably borders the top layer and the metallic contact regions directly. The adhesion promoter layer can be thin, for example, no more than 10 nm or 5 nm thick, in particular at the metallic contact regions.

The mirror islands may be in direct contact with the top layer. Furthermore, the mirror islands are designed to be electrically insulating in a direction perpendicular to the multiple quantum well structure when the semiconductor chip is used for its intended purpose. A material of the mirror islands that borders the top layer is particularly preferably a transparent, dielectric material such as silicon oxide or aluminum oxide.

The mirror islands may be covered, preferably completely covered, by a closing mirror layer on a side facing away from the multiple quantum well structure. The closing mirror layer can directly border the mirror islands and can be formed from the same material as the metallic contact regions, in particular from silver or aluminum. Between a dielectric material of the mirror islands and the closing mirror layer, an adhesion promoter layer, particularly composed of a TCO, can also be applied.

In the region of the mirror islands, in a direction away from the top layer, the mirror may be formed from the following partial layers in the specified order:

$SiO_2$ with a thickness of at least 100 nm or 150 nm or 500 nm and/or no more than 600 nm or 1 µm, particularly preferably 580 nm, TCO, in particular ZnO, with a thickness of at least 1 nm or 3 nm or 50 nm and/or 300 nm or 150 nm or no more than 50 nm or 20 nm, preferably 80 nm to 120 nm, Ag with a thickness of at least 50 nm or 100 nm and/or no more than 300 nm or 200 nm, and TCO, in particular ZnO, with a thickness of at least 2 nm or 5 nm or 50 nm and/or no more than 300 nm or 150 nm or 100 nm or 40 nm.

The mask islands may be formed by regular structures, seen in top view. For example, the mask islands are circular or in the form of polygons such as hexagons or octagons. Furthermore, the mask islands are preferably arranged in a regular hexagonal lattice, with the mask islands being located on corner points of the lattice.

An average diameter of the mask islands may be at least 0.25 µm or 0.5 µm or 1 µm. Alternatively or in addition, the average diameter is no more than 10 µm or 5 µm or 3 µm or 2 µm. An average distance between adjacent mask islands is alternatively or in addition at least 0.5 µm or 1 µm and/or no more than 5 µm or 3 µm or 2 µm or 1.5 µm. A surface proportion of the nucleation layer covered by the mask islands is preferably no more than 60% or 40% or 30% and/or at least 15% or 30%.

An average width of the upper sides of the ribs before step D) and after step C) may be smaller than the average distance between adjacent mask islands of the mask layer. Preferably, the average width of the ribs is no more than 70% or 50% or 35% of the average distance between the mask islands. Furthermore, seen in top view, a surface proportion of the upper sides of the ribs is preferably no more than 60% or 40% or 30% or 20% of the total surface area of the nucleation layer, seen in top view. Alternatively or in addition, the surface proportion of the upper side, seen in top view, is at least 15% or 30%.

After step C) and before step D) the ribs may have a shape in the form of a truncated pyramid in free spaces between the upper sides. In particular, these free spaces are truncated hexagonal pyramids.

The first growth step in method step C) may take place at a lower growth temperature than the second growth step in method step D).

Before step I), i.e., before the removal of the growth substrate, a carrier may be applied on the mirror. For example, the carrier is soldered or bonded to the mirror. The carrier is preferably the constituent of the finished semiconductor chips that mechanically supports and mechanically stabilizes the semiconductor chips. Thus, the carrier preferably remains in the finished semiconductor chip.

A current may be applied to the multiple quantum well structure exclusively via the carrier and/or exclusively from the direction of the carrier. For this purpose, electrical connections for applying current to a side of the multiple quantum well structure facing away from the carrier can be passed both through the mirror and through the multiple quantum well structure, in particular into the current expansion layer and/or the coalescence layer.

Regions directly above the upper sides of the ribs on a side of the coalescence layer facing away from the growth substrate may have a higher dislocation density than regions which, seen in top view, lie between the upper sides of the ribs. As a result, the multiple quantum well structure may also have a higher density of the V-defects in particular in the regions above the upper sides of the ribs than in the regions between the upper sides of the ribs, seen in top view.

The regions with the higher density of V-defects, starting from the metallic contact regions of the mirror, may be designed to conduct current into the multiple quantum well structure and, less preferably, through the multiple quantum well structure in a direction perpendicular to the mirror. In other words, the V-defects act as vertical current paths.

The mask layer may still be partially or completely present in the finished semiconductor chip. In other words, the mask layer is then a component of the finished semiconductor chip and in particular represents part of a radiation exit surface of the semiconductor chip. If the mask layer consists of, for example, a stack of layers of $SiO_2/SiN/SiO_2$, preferably at least the SiN partial layer, in which the LLO is also effective, is detached in particular by wet chemical means so that it does not act as an absorber in the finished semiconductor chip.

All or part of the nucleation layer, in particular at least 90%, may be removed. In other words, the nucleation layer is then no longer present in the finished semiconductor chip or is present only in a negligible proportion.

The roughening may not extend into the multiple quantum well structure. It is possible in this case that the roughening is limited to the coalescence layer and then does not extend into the optional, additional current expansion layer.

The regions with the high density of V-defects may extend from the metallic contact regions of the mirror through the multiple quantum well structure to the coalescence layer, in particular to the upper sides of the ribs. As a result, particularly high vertical current conductivity can be achieved. Alternatively, the V-defects extend through the multiple quantum well structure, but not as far as the ribs. For example, the V-defects in this case start, seen along the growth direction, approximately 200 nm below the multiple quantum well structure. A maximum average distance between the multiple quantum well structure and a beginning of the V-defects, along the growth direction, is preferably no more than 250 nm or 500 nm or 1000 nm.

In addition, I provide an optoelectronic semiconductor chip. The semiconductor chip is produced by my methods as provided in conjunction with one or more of the above-mentioned examples. Features of the semiconductor chip are therefore also disclosed for the method and vice versa.

A method as described here and an optoelectronic semiconductor chip as described here are explained in more detail with reference to the drawing with the aid of examples. The same reference numbers refer to the same elements in the individual figures here. However, the illustrations are not to scale; rather, to make them easier to understand, the size of individual elements may be exaggerated.

In FIG. 1, method steps of producing an optoelectronic semiconductor chip 10 are shown in diagrammatic form. According to FIG. 1A, a growth substrate 1 is prepared. The growth substrate 1 is, for example, a sapphire substrate. Alternatively, a silicon substrate can also be used.

In the method step as shown in FIG. 1B, a nucleation layer 2 is created directly on the growth substrate 1. The nucleation layer is, for example, an AlN layer.

According to FIG. 1C, a mask layer 3 is applied directly on to the nucleation layer 2. For example, the mask layer 3 is a stack of layers composed of $SiO_2$-silicon nitride-$SiO_2$, in particular with a layer thickness of 25 nm to 250 nm in each case, for example, approximately 100 nm each. The middle layer of the mask 3 in this case the silicon nitride layer, can have an absorbing action for UV radiation here.

In FIG. 1D, the mask layer 3 is preferably patterned by photolithography and subsequent etching. A top view diagram is shown in FIG. 1E relating to the sectional illustration in FIG. 1D. The resulting mask layer 3 is thus formed by a plurality of circular mask islands arranged in a regular, hexagonal lattice.

In the method step as shown in the sectional illustration in FIG. 1F, a coalescence layer 4 is grown starting from the nucleation layer 2. In a first growth step, predominantly vertical growth takes place, i.e., growth in a direction perpendicular to the nucleation layer 2. Seen in a cross-section 44, a trapezoidal form is thus obtained in a region above the mask layer 3, seen in a direction away from the growth substrate 1.

As can be seen from the top view in FIG. 1G, wherein FIG. 1G represents an SEM image, contiguous ribs 41 are formed by this first growth step from FIG. 1F, which have an upper side 42 facing away from the growth substrate 1. This upper side 42 is oriented parallel to the nucleation layer 2. In FIG. 1H, a detailed image from FIG. 1G is shown. An average width of the ribs, in a direction parallel to the nucleation layer 2, is in particular approximately 500 nm here.

This first vertical growth results in dislocations 46, starting from the nucleation layer 2, which extend in an approximately vertical direction through the ribs 41 to the upper side 42 and to side walls. To reduce the number of dislocations 46 in the subsequent layer, the growth step as illustrated in FIG. 1F is generally continued until the upper side 42 disappears. Deviating from this in the method as described here, however, this growth step is ended prematurely so that the upper side 42 remains and the ribs 41 are formed, as illustrated in conjunction with FIGS. 1F to 1H.

As shown in FIG. 1I, in a second growth step for the coalescence layer 4 substantially horizontal growth takes place. As a result, the dislocations 46 that end at the side walls of the ribs 42 from FIG. 1F deviate in an approximately horizontal direction. The coalescence layer 4 is preferably formed from undoped GaN or at least from GaN that has not been intentionally doped.

These nucleation layers, mask layers and coalescence layers are also provided in DE 10 2011 114 671 A1, in particular paragraphs 43 to 48 and 55 to 61 and claims 2, 5, 7 and 10. In particular, middle layers can also be present, as described therein. The disclosure of DE '671 is incorporated herein by reference.

Furthermore, the growth of the coalescence layer and construction of the mask layer can take place as provided in WO 2014/048805 A1, in particular page 7, line 17 to page 9, line 25 and page 11, line 20 to page 13, line 24. The relevant disclosure of WO '805 is also incorporated herein by reference.

Growth conditions for the vertical and horizontal growth of GaN can be taken for instance from Hiramatsu et al. In Journal of Crystal Growth, vol. 221, pages 316 to 326 from the Year 2000 and Gibart in Reports on Progress in Physics, vol. 67, pages 667 to 715 from the year 2004. The disclosure of Hiramatsu and Gibart is incorporated herein by reference.

According to FIG. 1J, a multiple quantum well structure 5 is grown on to the coalescence layer 4 which, after the method step in FIG. 1I, is a continuous and smooth layer. The multiple quantum well structure 5 has alternate barrier layers 52 and quantum well layers 51, cf. also FIG. 3A. In the regions between the mask islands of the mask layer 3, dislocations 46, also referred to as V-defects, are exposed on an upper side of the coalescence layer 4 facing away from the nucleation layer 2. At dislocations 46, V-defects are formed in the multiple quantum well structure 5, which continue in a direction away from the nucleation layer 2. Alternatively, the V-defects can also be propagated in a special defect formation layer, not illustrated. Such a defect formation layer creates an increased number of V-defects and preferably does not have a superlattice structure, unlike the multiple quantum well structure 5. The defect formation layer is preferably located approximately 200 nm before the multiple quantum well structure 5 along the growth direction of the semiconductor layer sequence.

According to FIG. 1K, a top layer 6 is grown directly on to the multiple quantum well structure 5, the top layer 6 being based on p-doped GaN. The top layer 6 is grown such that it projects into the V-defects in the multiple quantum well structure 5 and fills these V-defects.

Figure 3:
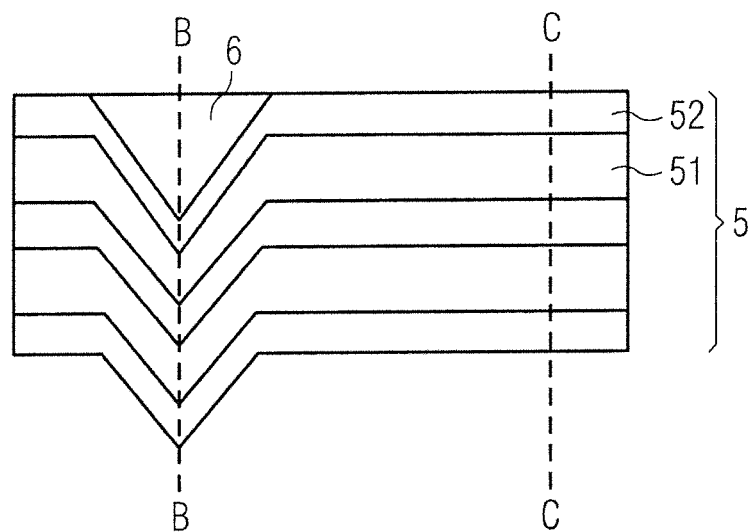
FIGS. 3A-3C show schematic diagrams of a multiple quantum well structure for an optoelectronic semiconductor chip.
Figure 3:
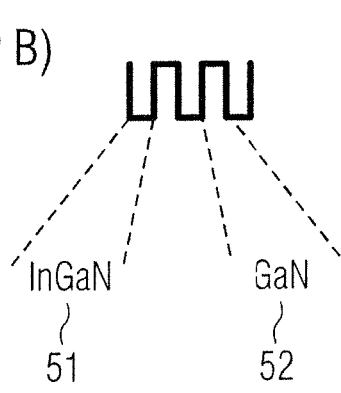
Figure 3:
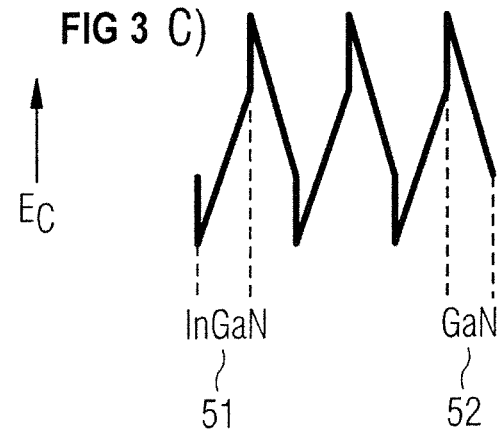

In regions with many V-defects, a different band structure is therefore obtained com-pared with regions next to the defects, cf. the schematic diagrams of a band energy $E_c$ in FIGS. 3B and 3C along the section lines B-B and C-C from FIG. 3A. Along these V-defects, improved current conduction therefore takes place through and into the multiple quantum well structure 5. As a result, the multiple quantum well structure 5 can have a relatively large number of quantum well layers 51 which are supplied with current and/or radiatively active, and therefore the radiation-generating efficiency of the semiconductor layer sequence can be increased.

It is shown in FIGS. 1L and 1M that a mirror 7 is applied on to the top layer 6. According to FIG. 1L, a layer composed of a dielectric material, for example, a silicon dioxide layer 72a, is first applied directly on to the top layer 6. On to this silicon dioxide layer 72a, a ZnO layer 72b is then applied continuously. Next, a plurality of mirror islands 72 are created by lithography and etching. The mirror islands 72 here are arranged in registry with or approximately in registry with the mask islands of the mask layer 3. In other words, the resulting structure of the mirror islands 72 can be shaped as shown in FIG. 1E for the mask islands of the mask layer 3.

To shape the mirror islands 72 by photolithography, the mask islands can be used as a shadow mask for a photoresist which is illuminated from the growth substrate 1 with a radiation for which the mask islands are impermeable. Likewise, an adjustment of the photographic techniques for the mirror islands 72 and the mask islands can be achieved by exciting the multiple quantum well structure 5 to photoluminescence. In this case, regions with many V-defects, i.e., the regions above the upper sides 42 of the ribs 41, appear darker.

According to FIG. 1M, contact regions 71 are created in the gaps between the mirror islands 72 that impress current into the top layer 6. The contact regions 71 are preferably metallic contact regions. For example, the contact regions 71 are formed from a metal such as silver.

Silver is also deposited on to the mirror islands 72 in the form of a closing mirror layer 73a. To improve adhesion, a ZnO layer 73b is optionally deposited on to the closing mirror layer 73a. By the contact regions 71, the mirror islands 72 and the closing mirror layers 73a and 73b, the mirror 7 is formed as a continuous, contiguous structure.

In contrast to the illustration, it is optionally possible that a layer to improve adhesion or to improve electrical contact, for example, a thin layer of a transparent conductive oxide such as ZnO, is located between the metallic contact region 71 and the top layer 6.

In the contact regions 71, the material of the contact regions normally has a reflective action for radiation generated in the multiple quantum well structure 5. If radiation hits the mirror islands 72 at comparatively flat angles, total reflection takes place at the mirror islands 72. With comparatively steeply incident radiation, this passes through the mirror islands 72 and is reflected back at the closing mirror layer 73a. Since a dielectric material such as silicon dioxide can be used for the mirror islands 72, the mirror islands 72 can have a lower refractive index on the top layer 6 on the one hand, which leads to increased total reflection. On the other hand, materials such as TCOs can be avoided. These TCOs exhibit increased absorption of radiation by comparison with dielectric materials such as silicon dioxide. Owing to the efficient current distribution along the V-defects in the multiple quantum well structure, it is possible to dispense with an electrically conductive material on the top layer 6 in the region of the mirror islands 72. In other words, the mirror islands 72 are in an electrically insulating form in a direction perpendicular to the mirror 7.

FIG. 1N shows that a permanent carrier 8 is applied on the mirror 7, for example, by soldering or bonding. To simplify the illustration, a connecting layer between the mirror 7 and the carrier 8 is not illustrated.

Mirrors with contact regions and mirror islands can also be taken from US 2010/0208763 A1, the disclosure of which is incorporated herein by reference.

FIG. 1O shows that the growth substrate 1 and the nucleation layer 2 are removed from the mask layer 3 and the coalescence layer 4, for example, by a laser lift-off method, wherein material breakdown can take place by laser radiation, preferably, for example, in a partial layer of the mask layer 3 or also in the nucleation layer 2.

Figure 4:
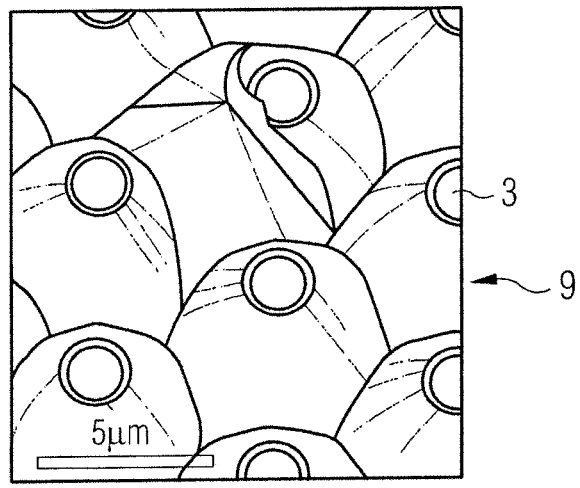
FIG. 4 shows a top view of a roughening for an optoelectronic semiconductor chip.

Next, a roughening 9 is created in particular by wet chemical etching, for example, using KOH, the roughening 9 preferably being limited to the coalescence layer 4. Alternatively, however, the roughening can also penetrate the coalescence layer 4 in some areas, the multiple quantum well structure 5 preferably not being affected by the roughening. A resulting structure is shown in an SEM image in FIG. 4.

The creation of this roughening preferably takes place as provided in DE 10 2012 101 211 A1, in particular paragraphs 15 and 53 to 67. The disclosure of DE '211 with regard to creating the roughening and also with regard to the nucleation layer, the mask layer and the coalescence layer and with regard to the multiple quantum well structure is incorporated herein by reference.

The finished semiconductor chip 10, as shown in FIG. 1P, is distinguished by high external and internal quantum efficiency. This is achieved in particular by the improved mirror 7 with the electrically insulating mirror islands 72 and the metallic contact regions 71 in conjunction with the V-defects, which extend from the contact regions 71 to the structures of the roughening 9.

Figure 2:
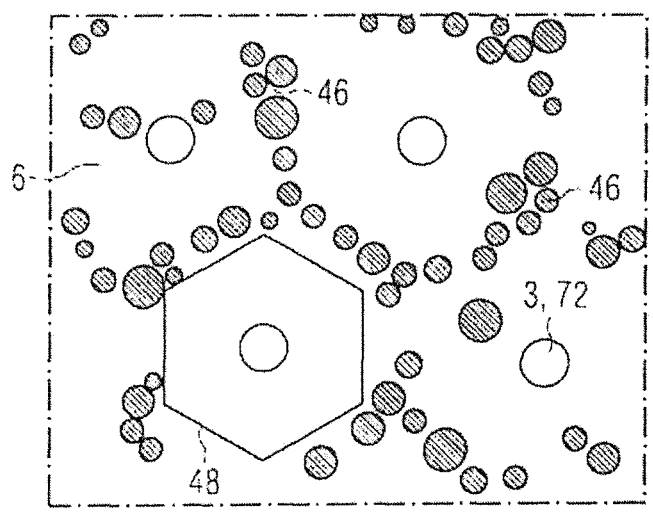
FIG. 2 shows a schematic top view of a coalescence layer for my method.

Because of the hexagonal lattice 48 seen in top view, cf. also the diagrammatic top view of the top layer 6 in FIG. 2, a uniform impressing current into the multiple quantum well structure 5 can be achieved, seen in top view. The dislocations 46 are located along the hexagonal lattice 48 here and there is a significantly reduced defect density between these regions.

The description with the aid of the examples does not limit my methods and chips described. Rather, this disclosure comprises any new feature and any combination of features, which in particular includes any combination of features in the appended claims, even if the feature or combination is not itself explicitly stated in the claims or examples.

This application claims priority of DE 10 2014 116 999.9, the disclosure of which is incorporated herein by reference.

The invention claimed is:

1. A method of producing an optoelectronic semiconductor chip comprising in order:
   A) creating a nucleation layer on a sapphire growth substrate,
   B) applying a mask layer onto the nucleation layer and patterning the mask layer into a plurality of mask islands,
   C) growing a coalescence layer, wherein the coalescence layer is grown starting from regions of the nucleation layer not covered by the mask islands, the coalescence layer having a first main growth direction perpendicular to the nucleation layer so that ribs are formed, which when seen in a top view form a lattice and have trapezoidal cross-sectional surfaces,
   D) further growing the coalescence layer predominantly with a second main growth direction parallel to the nucleation layer to form a contiguous and continuous layer,
   E) growing a multiple quantum well structure on the coalescence layer,
   F) applying a mirror having metallic contact regions that impress current into the multiple quantum well structure and mirror islands for reflection of some radiation generated in the multiple quantum well structure, and
   G) detaching the growth substrate and the nucleation layer, and creating a roughening by etching the coalescence layer, wherein the mask layer serves as an etching mask,
   wherein the mirror islands comprises a transparent, dielectric material, and
   wherein the roughening remains in the optoelectronic semiconductor chip.

2. The method according to claim 1, wherein
   the nucleation layer comprises or consists of one or more partial layers of aluminum nitride, aluminum oxynitride and/or AlGaN,
   the mask layer is made of a silicon oxide and/or a silicon nitride,
   the coalescence layer is made of GaN or of GaN and AlGaN,
   the multiple quantum well structure is based on the material system AlInGaN and generates blue light, and
   before step F), a top layer is fixated between the mirror and the multiple quantum well structure, which is made of p-doped GaN and, in some areas, extends into recesses of the multiple quantum well structure.

3. The method according to claim 2, wherein
the contact regions comprise or consist of Ag, Al and/or ZnO and the contact regions directly between the mirror islands are in direct contact with the top layer,
the top layer is applied directly onto the multiple quantum well structure,
the mirror islands are in direct contact with the top layer and are electrically insulating, and
the mirror islands are covered on a side facing away from the multiple quantum well structure by a closing mirror layer disposed on the mirror islands composed of a same material of the contact regions.

4. The method according to claim 2, wherein, in a region of the mirror island, in a direction away from the top layer, the mirror consists of partial layers in the specified order:
100 nm to 500 nm $SiO_2$,
1 nm to 20 nm ZnO,
50 nm to 300 nm Ag, and
2 nm to 150 nm ZnO.

5. The method according to claim 1, wherein the lattice composed of upper sides of the ribs facing away from the growth substrate and the metallic contact regions directly between the mirror islands have a regular hexagonal structure, seen in a top view.

6. The method according to claim 1, wherein the mask islands seen in a top view are circular and arranged in a regular hexagonal shape, an average diameter of the mask islands is 0.5 μm to 3 μm, and an average distance between adjacent mask islands is 0.5 μm to 3 μm.

7. The method according to claim 1,
wherein, before step G), a carrier is applied on the mirror, and
current is applied to the multiple quantum well structure with electrical connections.

8. The method according to claim 1,
wherein, on a side of the coalescence layer facing away from the growth substrate, a higher dislocation density is present over the ribs than between the ribs, and
the multiple quantum well structure has a higher density of V-defects over the ribs than between the ribs.

9. The method according to claim 8, wherein regions with a higher density of V-defects, starting from the metallic contact regions, conduct current into the multiple quantum well structure in a direction perpendicular to the mirror.

10. The method according to claim 8,
wherein the roughening does not extend into the multiple quantum well structure, and
the V-defects extend from the mirror through the multiple quantum well structure towards the coalescence layer.

11. The method according to claim 1,
wherein the mask islands or a portion of the mask islands comprise/comprises silicon nitride and have/has an absorptance of at least 60% for at least a portion of the spectrum between 240 nm and 480 nm.

12. An optoelectronic semiconductor chip produced by the method according to claim 11.

13. A method of producing an optoelectronic semiconductor chip comprising in order:
A) creating a nucleation layer on a sapphire growth substrate,
B) applying a mask layer onto the nucleation layer and patterning the mask layer into a plurality of mask islands,
C) growing a coalescence layer, wherein the coalescence layer is grown starting from regions of the nucleation layer not covered by the mask islands, the coalescence layer having a first main growth direction perpendicular to the nucleation layer so that ribs are formed, which when seen in a top view form a lattice and which have trapezoidal cross-sectional surfaces,
D) further growing the coalescence layer predominantly with a second main growth direction parallel to the nucleation layer to form a contiguous and continuous layer,
E) growing a multiple quantum well structure on the coalescence layer,
F) applying a mirror having metallic contact regions that impress current into the multiple quantum well structure and mirror islands for reflection of some radiation generated in the multiple quantum well structure, and
G) detaching the growth substrate and the nucleation layer, and creating a roughening by etching the coalescence layer, wherein the mask layer serves as an etching mask, and
wherein the roughening remains in the optoelectronic semiconductor chip.

* * * * *

UNITED STATES PATENT AND TRADEMARK OFFICE
CERTIFICATE OF CORRECTION

PATENT NO. : 10,535,515 B2  
APPLICATION NO. : 15/527402  
DATED : January 14, 2020  
INVENTOR(S) : Hertkorn Page 1 of 1

It is certified that error appears in the above-identified patent and that said Letters Patent is hereby corrected as shown below:

In the Claims

At Column 12, Line 64, please change "fixated" to -- formed --.

Signed and Sealed this  
Seventh Day of April, 2020

Andrei Iancu  
*Director of the United States Patent and Trademark Office*